(12) United States Patent
An

(10) Patent No.: US 8,456,932 B2
(45) Date of Patent: *Jun. 4, 2013

(54) SEMICONDUCTOR MEMORY APPARATUS

(75) Inventor: Yong Bok An, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 230 days.

This patent is subject to a terminal disclaimer.

(21) Appl. No.: 12/982,998

(22) Filed: Dec. 31, 2010

(65) Prior Publication Data

US 2012/0081979 A1   Apr. 5, 2012

(30) Foreign Application Priority Data

Sep. 30, 2010   (KR) .................. 10-2010-0095649

(51) Int. Cl.
*G11C 7/00*   (2006.01)

(52) U.S. Cl.
USPC .............. 365/189.16; 365/148; 365/230.06

(58) Field of Classification Search
USPC .............. 365/163, 189.14, 189.16, 148, 158, 365/171, 230.06, 233.1
See application file for complete search history.

(56) References Cited

U.S. PATENT DOCUMENTS

| 7,633,802 | B2 * | 12/2009 | Mokhlesi ................ | 365/185.18 |
| 7,706,189 | B2 * | 4/2010 | Dong et al. ............. | 365/185.19 |
| 7,937,630 | B2 * | 5/2011 | Mori ........................ | 714/718 |
| 2005/0088890 | A1 | 4/2005 | Matsunaga et al. | |
| 2006/0126390 | A1 | 6/2006 | Gorobets et al. | |
| 2007/0297245 | A1 | 12/2007 | Mokhlesi | |
| 2011/0261611 | A1 * | 10/2011 | An ............................ | 365/163 |
| 2011/0261612 | A1 * | 10/2011 | An ............................ | 365/163 |
| 2012/0081953 | A1 * | 4/2012 | An ............................ | 365/163 |

FOREIGN PATENT DOCUMENTS

| JP | 11-120778 | 4/1999 |
| JP | 2000-040383 | 2/2000 |
| KR | 1020040007339 A | 1/2004 |
| KR | 1020050120485 A | 12/2005 |
| KR | 1020100006666 A | 1/2010 |
| KR | 1020100052886 A | 5/2010 |
| KR | 1020100067841 A | 6/2010 |

* cited by examiner

*Primary Examiner* — Gene Auduong
(74) *Attorney, Agent, or Firm* — William Park & Associates Patent Ltd.

(57) ABSTRACT

A semiconductor memory apparatus includes a first write control code generation unit configured to generate a first write control code which is updated with different cycles which have different periods, in response to a programming verification flag signal and a programming enable signal, and a data write unit configured to output a first programming current pulse with a magnitude corresponding to a code combination of the first write control code which is updated.

33 Claims, 18 Drawing Sheets

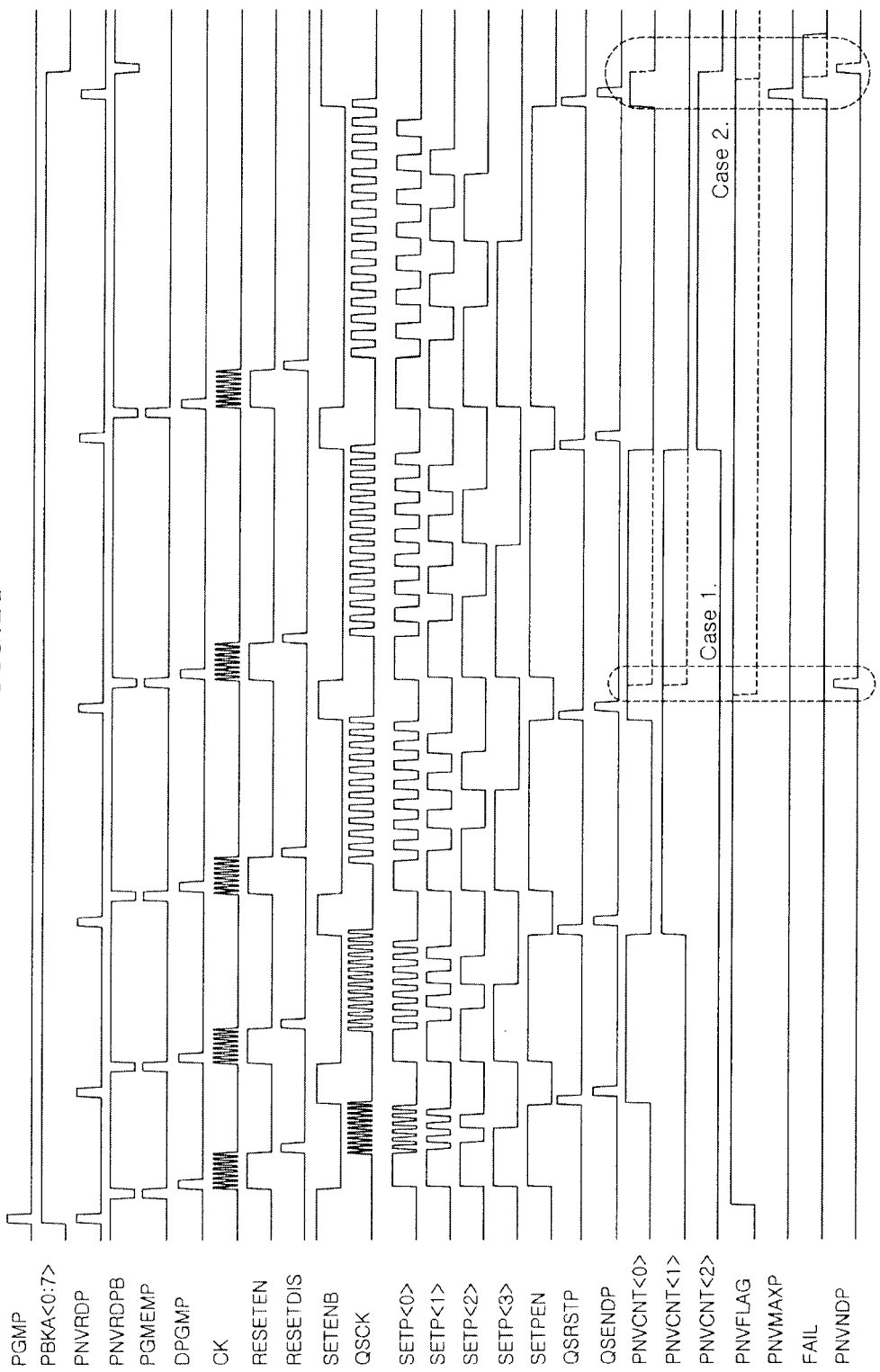

SEMICONDUCTOR MEMORY APPARATUS

CROSS-REFERENCES TO RELATED APPLICATION

The present application claims priority under 35 U.S.C. §119(a) to Korean application number 10-2010-0095649, filed on Sep. 30, 2010, in the Korean Intellectual Property Office, which is incorporated herein by reference in its entirety.

BACKGROUND

1. Technical Field

The present invention relates to a semiconductor memory apparatus, and more particularly, to a technology for generating a programming current pulse.

2. Related Art

A phase change random access memory (PCRAM) is a non-volatile memory apparatus which programs a memory cell through a programming current pulse.

A PCRAM has a characteristic of a non-volatile memory and may achieve a random access. Also, the PCRAM may be highly integrated at a low cost. The PCRAM stores data by using a phase change material. Specifically, the PCRAM stores data by using a phase change of a phase change material according to a temperature condition, that is, a change in a resistance value according to a phase change.

A phase change material can change to an amorphous state or a crystalline state according to a temperature condition. A representative phase change material is a chalcogenide alloy. A representative chalcogenide alloy is $Ge_2Sb_2Te_5$ composed of germanium (Ge), antimony (Sb), and tellurium (Te). Hence, a phase change material is generally called a "GST".

A PCRAM causes a reversible phase change of a phase change material (GST) between a crystalline state and an amorphous state by using Joule heating generated when a current is applied to the phase change material (GST) under certain conditions. In a known art, the crystalline state is referred to as a "set state". In the set state, the phase change material (GST) has a small resistance value. Also, the amorphous state is referred to as a reset state. In the reset state, the phase change material (GST) has a larger resistance value than that in the set state. That is to say, the PCRAM stores data through a change in a resistance value between the crystalline state and the amorphous state, and determines a level of the stored data by sensing a current flowing through the phase change material (GST) or a voltage change depending on a current change. In the known art, the set state is defined as a logic level of '0', and the reset state is defined as a logic level of '1'. A state of the phase change material (GST) may be continuously maintained even though power is interrupted.

Meanwhile, the amorphous state and the crystalline state of the phase change material (GST) may be mutually changed by a programming current pulse. A set programming current pulse is a programming current which changes the phase change material (GST) of a memory cell to the set state, and a reset programming current pulse is a programming current which changes the phase change material (GST) of the memory cell to the reset state.

As the phase change material (GST) is rapidly cooled after being heated to, for example, a temperature higher than a melting temperature for a certain time by the supply of the reset programming current pulse, the phase change material (GST) is changed to the amorphous state. Also, as the phase change material (GST) is slowly cooled after being heated to, for example, a temperature higher than a crystallization temperature and lower than the melting temperature for a certain time by the supply of the set programming current pulse, the phase change material (GST) is changed to the crystalline state. Meanwhile, because a resistance value can vary depending upon a ratio of an amorphous volume to a crystalline volume of the phase change material (GST), a memory cell can be configured in a multi-level form. In the known art, a large current is flowed as the reset programming current pulse for a time shorter than the set programming current pulse, and a small current is flowed as the set programming current pulse for a time longer than the reset programming current pulse. That is to say, the state of the phase change material (GST) is changed by Joule heating under a certain condition, which is generated due to the supply of the programming current pulse.

FIG. 1 is a diagram illustrating a memory cell of a known PCRAM.

Referring to FIG. 1, a memory cell includes a cell diode D1 and a phase change element GST.

An example of the basic operations of the PCRAM configured as mentioned above will be described below.

First, an operation for programming data to the phase change element GST is performed as follows.

When a word line WL is activated to a low level, e.g., a ground voltage, and a certain voltage for a program operation begins to be applied through a bit line BL, since a cell diode D1 becomes a forward biased state, the cell diode D1 is turned on from when a voltage difference between the anode and the cathode of the cell diode D1 is higher than a threshold voltage. As a result, a current path for the program operation is formed among the bit line BL, the phase change element GST, and the word line WL. Therefore, by supplying a programming current pulse corresponding to data to the phase change element GST through the bit line BL, the phase change element GST can be changed to the crystalline state or the amorphous state. Here, if the data to be programmed has a logic level of '1', the phase change element GST is changed to a reset state by supplying a reset programming current pulse, and if data to be programmed has a logic level of '0', the phase change element GST may be changed to a set state by supplying a set programming current pulse. As mentioned above, the reset state as the amorphous state has a larger resistance value than the set state as the crystalline state.

Also, an operation for detecting the data programmed to the phase change element GST is performed as follows.

When the word line WL is activated to the low level, e.g., the ground voltage, and a certain voltage for a read or a verification operation ("a read operation") begins to be applied through the bit line BL, since the cell diode D1 becomes the forward biased state, the cell diode D1 is turned on from when the voltage difference between the anode and the cathode of the cell diode D1 is higher than the threshold voltage. As a result, a current path for the read operation is formed among the bit line BL, the phase change element GST, and the word line WL. Therefore, when a certain voltage or a certain current for the read operation is applied to the phase change element GST through the bit line BL, an amount of current flowing through the phase change element GST or the magnitude of a voltage drop in the phase change element GST varies depending upon the resistance value of the phase change element GST. Therefore, data stored in the phase change element GST is discriminated.

FIG. 2 is a configuration diagram of a data write unit of a known PCRAM.

Referring to FIG. 2, a data write unit includes a current control section 10, a current driving section 20, and a selection section 30.

The current control section 10 is configured to control a voltage level of a control node N1 in response to a set control signal SETP and a reset control signal RESETP when a write enable signal WDEN is activated. Current driving forces of an NMOS transistor MN1 controlled by the set control signal SETP and an NMOS transistor MN2 controlled by the reset control signal RESETP may be designed to be different from each other. The set control signal SETP and the reset control signal RESETP may be inputted in a pulse type.

The current driving section 20 is configured to drive a programming current pulse I_PGM with a magnitude corresponding to the voltage level of the node N1, to an output terminal N2. The programming current pulse I_PGM can be classified into a set programming current pulse corresponding to the set control signal SETP and a reset programming current pulse corresponding to the reset control signal RESETP.

The selection section 30 is configured to output the programming current pulse I_PGM driven from the current driving section 20 to bit lines BL0 through BL3 which respectively correspond to a plurality of select signals YSW<0:3>.

FIG. 3 is a graph showing programming current pulses which are outputted from the data write unit of FIG. 2.

Referring to FIG. 3, it is to be appreciated that a reset programming current pulse is driven for a short time to be higher than a melting temperature and a set programming current pulse is driven for a long time when compared to the reset programming current pulse, to be lower than the melting temperature. For reference, in the drawing, the reset programming current pulse is shown as an amorphizing pulse, and the set programming pulse is shown as a crystallizing pulse. In general, the more the magnitude of the reset programming current pulse is great, the more the resistance value of a phase change memory cell increases. Also, the more the supply time of the set programming current pulse is lengthened, the more the resistance value of the phase change memory cell gradually decreases.

Meanwhile, in a semiconductor memory apparatus, a number of phase change memory cells are provided, and the programming characteristics of the respective phase change memory cells are different due to variables in processes. That is to say, even though a programming current pulse of the same magnitude is applied for the same time, the phase change memory cells are programmed with different resistance values due to different programming characteristics. Accordingly, a technology for stably programming a plurality of phase change memory cells with differences in programming characteristics is demanded in the art.

SUMMARY

In an exemplary embodiment of the present invention, a semiconductor memory apparatus includes a first write control code generation unit configured to generate a first write control code which is updated with different cycles which have different periods, in response to a programming verification flag signal and a programming enable signal, and a data write unit configured to output a first programming current pulse with a magnitude corresponding to a code combination of the first write control code which is updated.

In another exemplary embodiment of the present invention, a semiconductor memory apparatus includes a period control signal generation unit configured to generate a period control signal which is activated after a first time, in response to a programming enable signal, a first write control code generation unit configured to generate a first write control code which is updated with different cycles which have different periods, in response to a programming verification flag signal and a programming enable signal, wherein the first write control code generation unit updates the first write control code in response to the period control signal, a second write control code generation unit configured to generate a second write control code, in response to the programming enable signal, and a data write unit configured to output a first programming current pulse with a magnitude corresponding to a code combination of the first write control code which is updated or a second programming current pulse with a magnitude corresponding to the second write control code.

In yet another exemplary embodiment of the present invention, a semiconductor memory apparatus includes an input latch section configured to output a count enable signal and a clock enable signal in response to a period control signal which is activated after a preset time and a latch reset pulse signal, a clock generation control section configured to output a cycle setting code and a repetition end signal, in response to a programming verification flag signal and the latch reset pulse signal, wherein the cycle setting code is updated by a specific number of times, a counting clock generation section configured to generate a counting clock signal in response to the clock enable signal and the cycle setting code, wherein a period of a toggling cycle of the counting clock signal is changed depending upon a code value of the cycle setting code, a write control code counter section configured to generate a counting code which is counted in response to a programming enable signal, the count enable signal and the counting clock signal, and output a write control code, a latch reset pulse generation section configured to generate the latch reset pulse signal when the counting code reach a predetermined value, and a data write unit configured to output a programming current pulse with a magnitude corresponding to a code combination of the write control code which is updated.

BRIEF DESCRIPTION OF THE DRAWINGS

Features, aspects, and embodiments are described in conjunction with the attached drawings, in which:

FIG. 21 is a timing diagram illustrating internal operations of the semiconductor memory apparatus in accordance with the exemplary embodiment of the present invention.

DETAILED DESCRIPTION

Hereinafter, a semiconductor memory apparatus according to the present invention will be described below with reference to the accompanying drawings through exemplary embodiments.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. In general, the logic signals of a circuit and binary data values are divided into a high level (H) and a low level (L) in correspondence to voltage levels and may be represented as '1' and '0'. Furthermore, as the occasion demands, a high impedance state (a high-Z state) may be defined and described.

Figure 1:
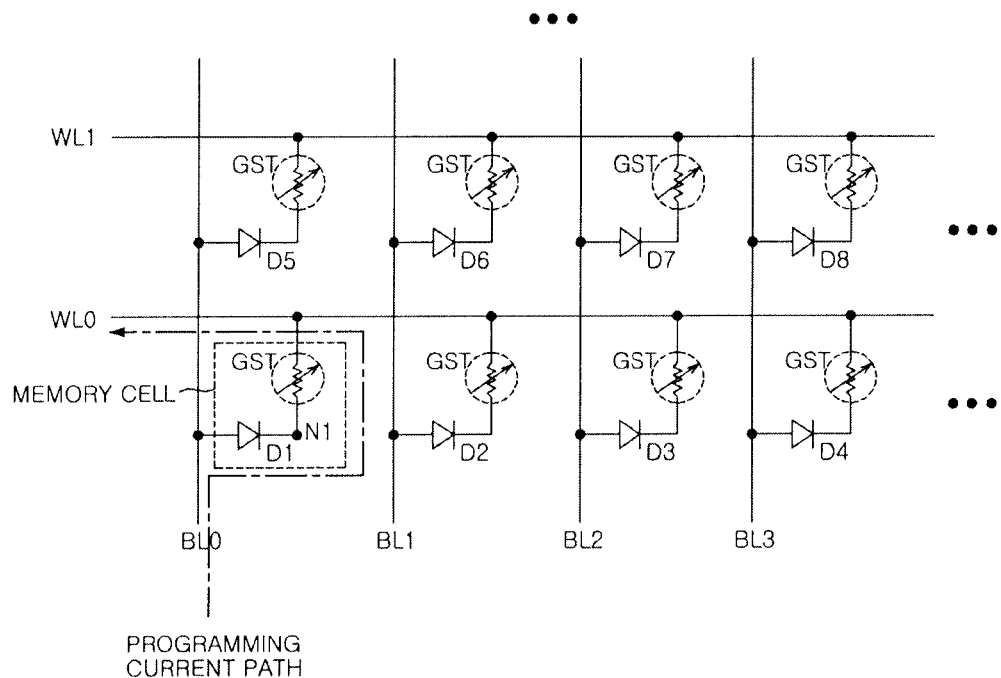
FIG. 1 is a diagram illustrating a memory cell of a known PCRAM.
Figure 2:
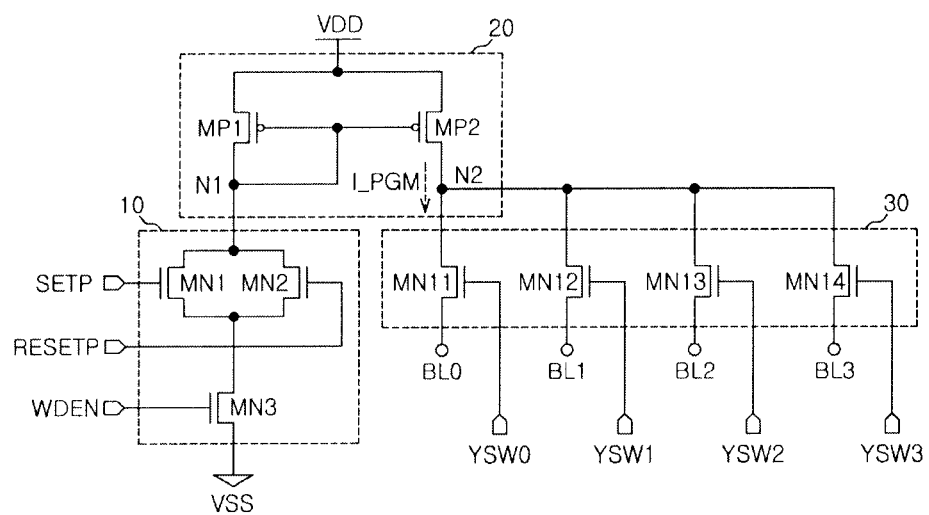
FIG. 2 is a configuration diagram of a data write unit of the known PCRAM.
Figure 3:
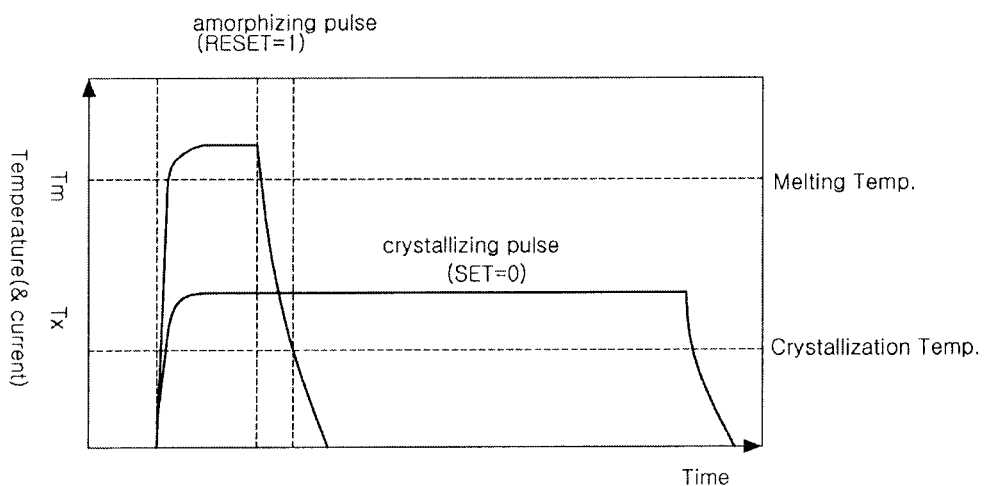
FIG. 3 is a graph showing programming current pulses which are outputted from the data write unit of FIG. 2.
Figure 4:
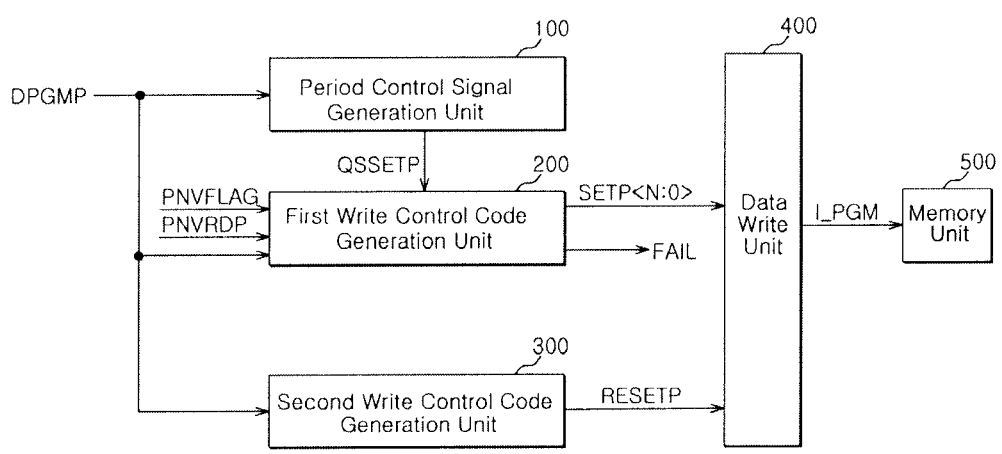
FIG. 4 is a configuration diagram illustrating a semiconductor memory apparatus in accordance with an exemplary embodiment of the present invention.

FIG. 4 is a configuration diagram illustrating a semiconductor memory apparatus in accordance with an exemplary embodiment of the present invention.

The semiconductor memory apparatus in accordance with the present exemplary embodiment of the invention includes only a simplified configuration for the sake of clear description of essential characteristics.

Referring to FIG. 4, a semiconductor memory apparatus includes a period control signal generation unit 100, a first write control code generation unit 200, a second write control code generation unit 300, a data write unit 400, and a memory unit 500.

The detailed configuration and operations of the semiconductor memory apparatus configured as mentioned above will be described below.

The period control signal generation unit 100 is configured to generate a period control signal QSSETP which is activated after a first time, in response to a programming enable signal DPGMP. That is to say, the period control signal QSSETP is activated after the first time from an activation timing of the programming enable signal DPGMP.

The first write control code generation unit 200 is configured to generate a first write control code SETP<N:0> which is updated for each of a plurality of periods with a different cycle, in response to a programming verification flag signal PNVFLAG and the programming enable signal DPGMP. The first write control code generation unit 200 updates the first write control code SETP<N:0> in response to the period control signal QSSETP in each period. In the present exemplary embodiment, configuration is made in such a manner that a period of the update cycle of the first write control code SETP<N:0> gradually increases. That is, according to an example, if program verification is not passed (if program is not completed) after a first "set" program pulse, a second "set" program pulse, which has a longer period of the update cycle of the first write control code SETP<N:0>, is applied.

The second write control code generation unit 300 is to configured to generate a second write control code RESETP which is activated for a certain time, in response to the programming enable signal DPGMP.

The data write unit 400 is configured to output a programming current pulse I_PGM which has a magnitude corresponding to a code combination of the updated first write control code SETP<N:0> or a magnitude corresponding to the second write control code RESETP. The programming current pulse I_PGM may be classified into a first programming current pulse corresponding to the first write control code SETP<N:0> or a second programming current pulse corresponding to the second write control code RESETP. The programming current pulse I_PGM outputted from the data write unit 400 is transferred to the memory unit 500 and is supplied to a corresponding memory cell selected among a plurality of memory cells. In the present exemplary embodiment, the memory cells are assumed to be phase change memory cells.

Figure 5:
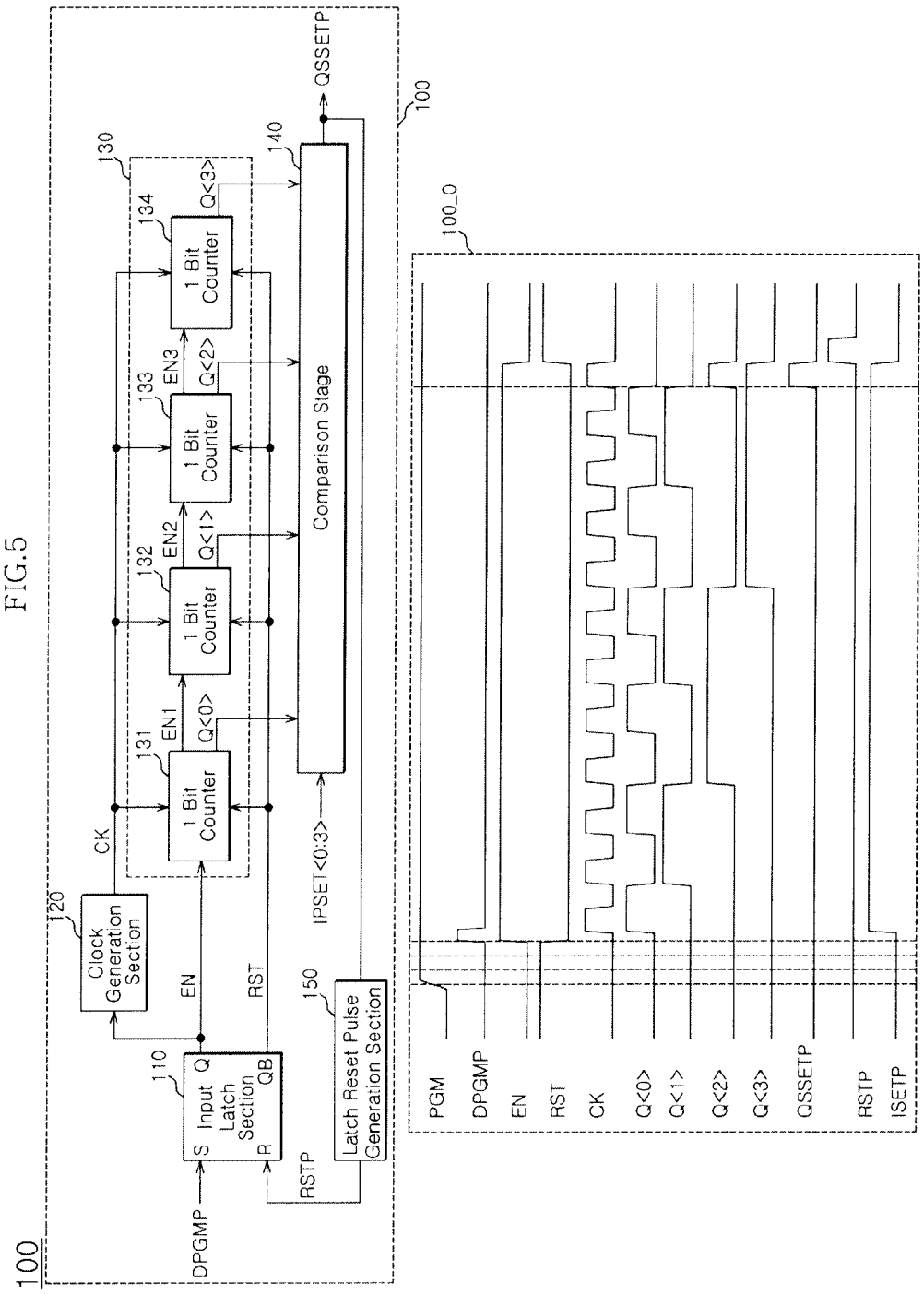
FIG. 5 is a configuration diagram illustrating an exemplary embodiment of the period control signal generation unit shown in FIG. 4 and a timing diagram illustrating internal operations of the period control signal generation unit.

FIG. 5 is a configuration diagram illustrating an exemplary embodiment of the period control signal generation unit shown in FIG. 4 and a timing diagram illustrating internal operations of the period control signal generation unit.

Referring to FIG. 5, the period control signal generation unit 100 includes an input latch section 110, a clock generation section 120, a counter section 130, a comparison section 140, and a latch reset pulse generation section 150.

Operations of the period control signal generation unit 100 configured as mentioned above will be described below with reference to a diagram 100_0.

The input latch section 110 is configured to output a count enable signal EN and a reset signal RST in response to the programming enable signal DPGMP and a latch reset pulse signal RSTP. In other words, the count enable signal EN is activated to a high level when the programming enable signal DPGMP pulses to a high level, and the reset signal RST is activated to a high level when the latch reset pulse signal RSTP pulses to a high level.

The clock generation section 120 is configured to generate a clock signal CK in response to the count enable signal EN. Namely, the clock generation section 120 generates the clock signal CK which toggles while the count enable signal EN is activated to the high level.

The counter section 130 is configured to output a counting code Q<0:3> which is counted in response to the count enable signal EN, the reset signal RST and the clock signal CK. That is to say, the counter section 130 performs a counting operation under the control of the clock signal CK when the count enable signal EN is activated to the high level. If the reset signal RST is activated to the high level, the counting code Q<0:3> which is outputted from the counter section 130 is initialized. In the case where the counting code Q<0:3> is generated using the counter section 130 in this way, a size of a circuit may decrease.

The comparison section 140 is configured to activate and output the period control signal QSSETP when the counting code Q<0:3> reaches a certain value. The comparison section 140 is configured to compare the counting code Q<0:3> and a setting time control code IPSET<0:3> and activate the period control signal QSSETP when the counting code Q<0:3> is the same as the setting time control code IPSET<0:3>. That is to say, an activation timing of the period control signal QSSETP may be controlled by controlling the setting time control code IPSET<0:3>.

The latch reset pulse generation section 150 is configured to delay the period control signal QSSETP by a certain time and output the latch reset pulse signal RSTP. The latch reset pulse generation section 150 may include a delay stage, and a delay value of the delay stage may be set to satisfy a certain timing margin.

Hereafter, a detailed exemplary configuration of the period control signal generation unit 100 will be described.

Figure 6:
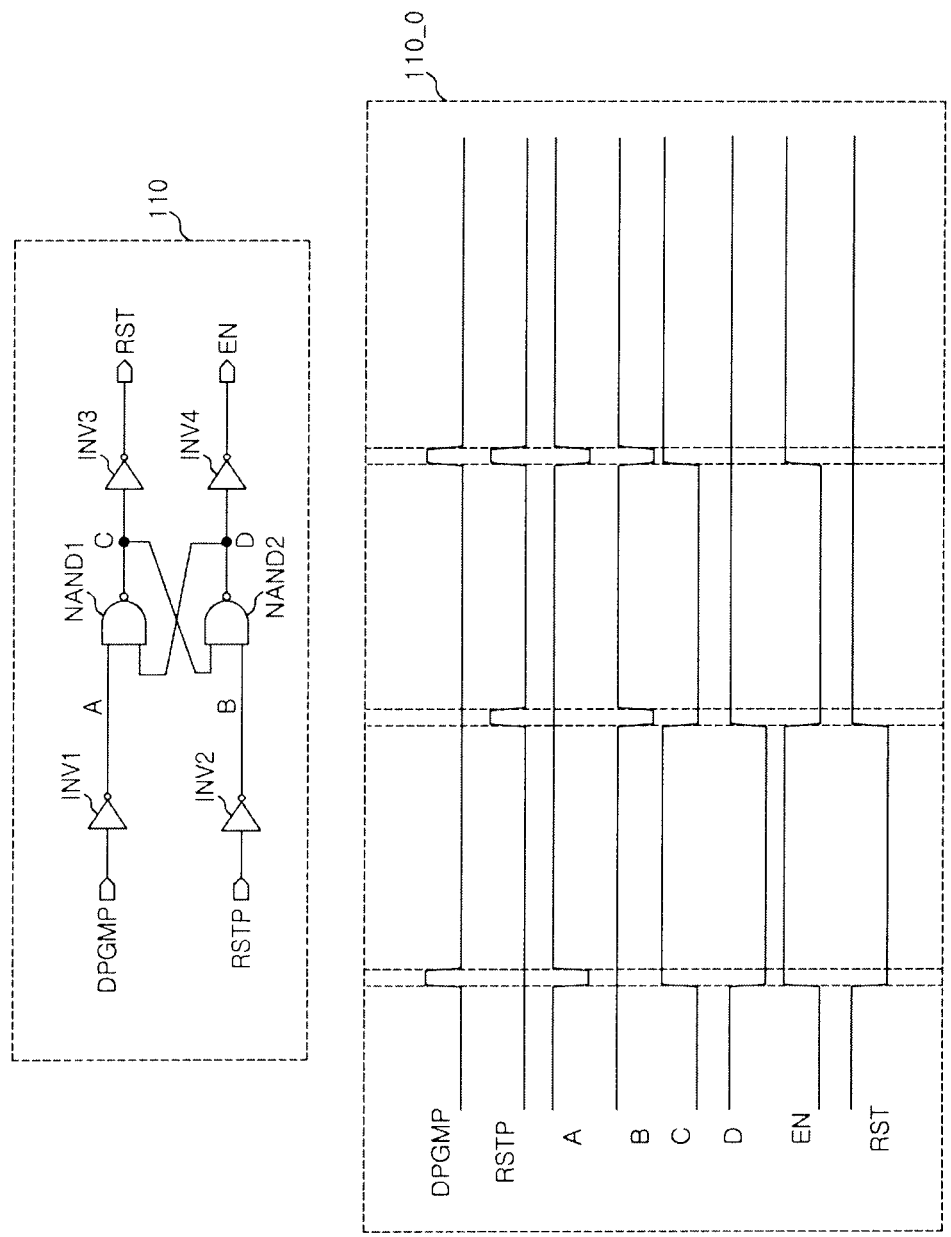
FIG. 6 is an exemplary configuration diagram of the input latch section of the period control signal generation unit shown in FIG. 5 and a timing diagram illustrating internal operations of the input latch section.

FIG. 6 is a configuration diagram of the input latch section of the period control signal generation unit shown in FIG. 5 and a timing diagram illustrating internal operations of the input latch section.

Referring to FIG. 6, the input latch section 110 includes an RS latch which is composed of a plurality of NAND gates NAND1 and NAND2. Referring to a timing diagram 110_0, in the input latch section 110, the count enable signal EN is activated to the high level when the programming enable signal DPGMP pulses to the high level, and the reset signal RST is activated to the high level when the latch reset pulse signal RSTP pulses to the high level.

Figure 7:
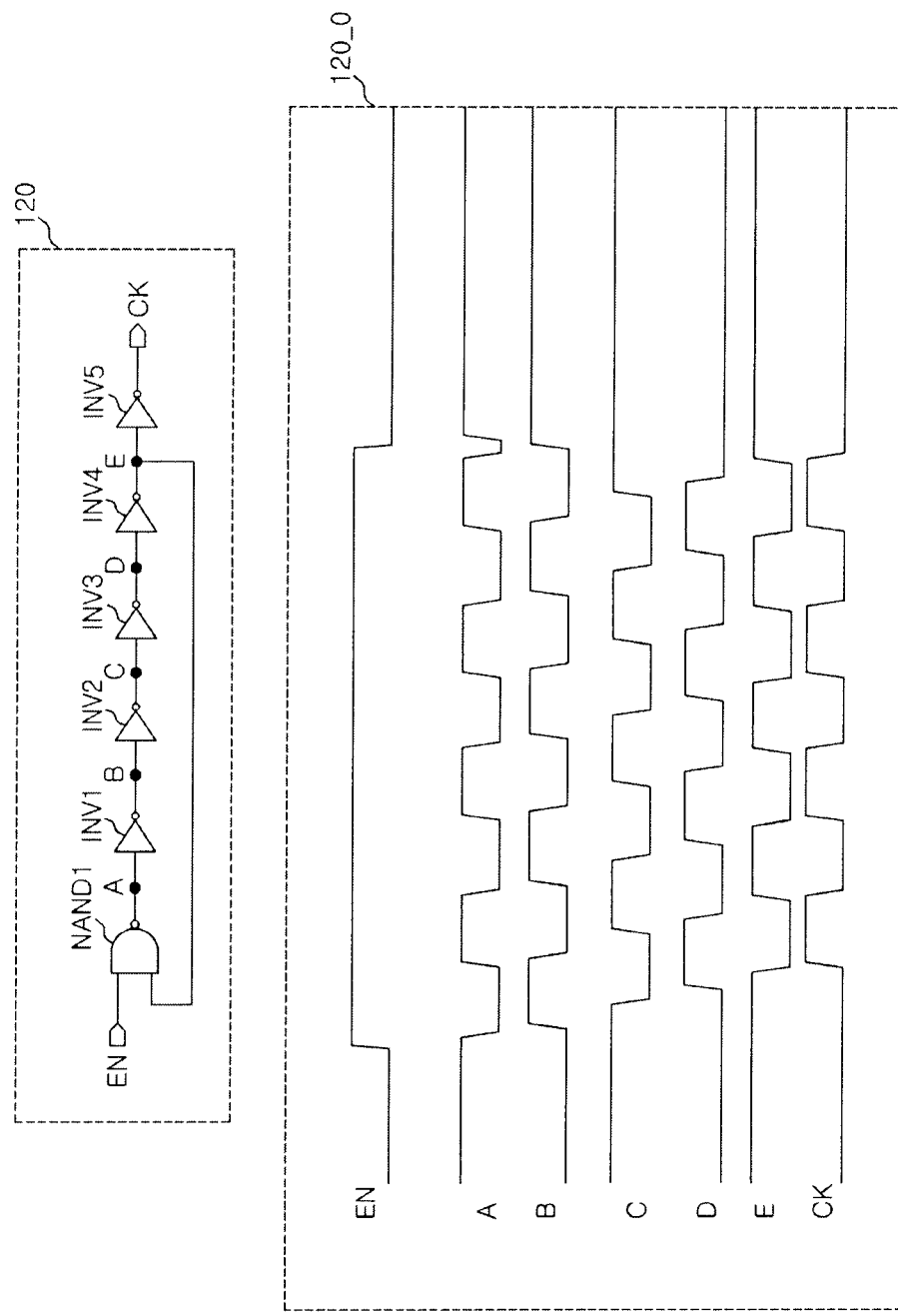
FIG. 7 is an exemplary configuration diagram of the clock generation section of the period control signal generation unit shown in FIG. 5 and a timing diagram illustrating internal operations of the clock generation section.

FIG. 7 is an exemplary configuration diagram of the clock generation section of the period control signal generation unit shown in FIG. 5 and a timing diagram illustrating internal operations of the clock generation section.

Referring to FIG. 7, the clock generation section 120 includes a ring oscillator which is composed of a NAND gate NAND1 and a plurality of inverters INV1 through INV5. Referring to a timing diagram 120_0, the clock generation section 120 outputs the clock signal CK which toggles while the count enable signal EN is activated to the high level.

Figure 8:
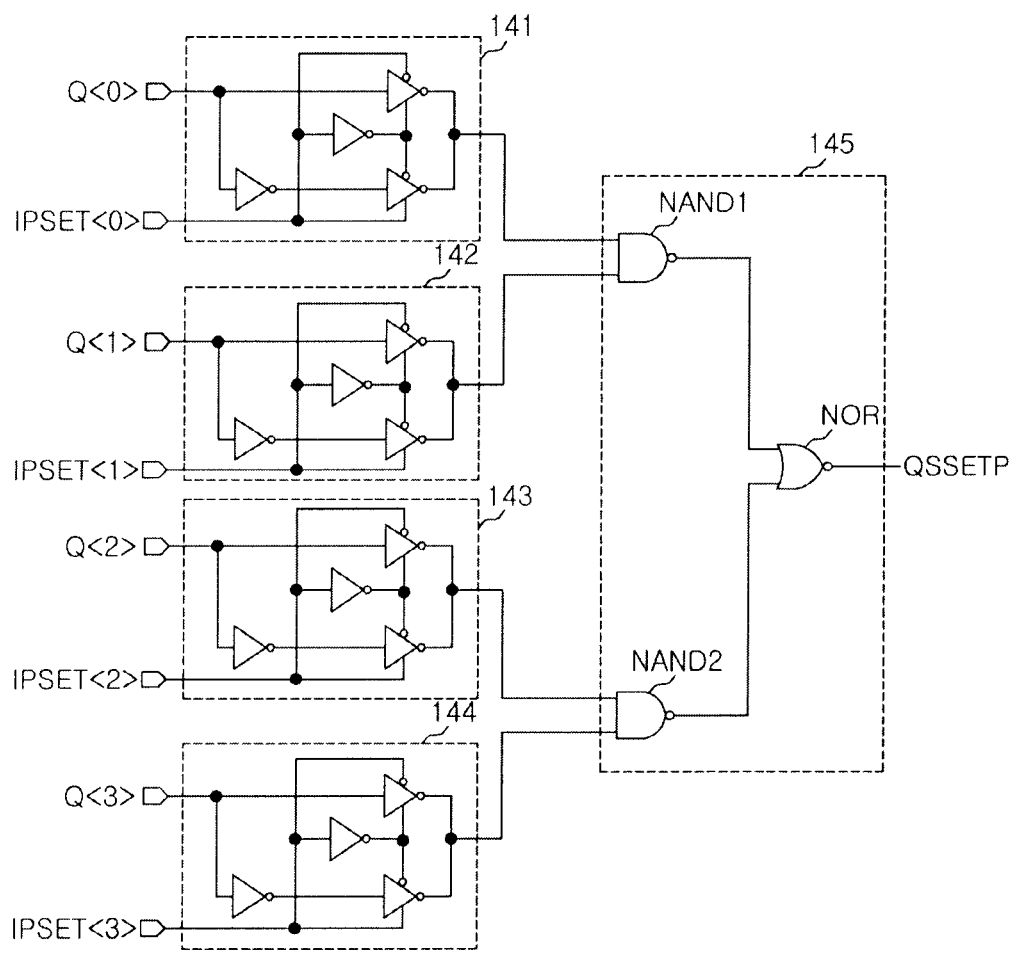
FIG. 8 is an exemplary configuration diagram of the comparison section of the period control signal generation unit shown in FIG. 5.

FIG. 8 is an exemplary configuration diagram of the comparison section of the period control signal generation unit shown in FIG. 5.

Referring to FIG. 8, the comparison section 140 includes a plurality of comparison stages 141, 142, 143 and 144, and a signal combination stage 145. The plurality of comparison stages 141, 142, 143 and 144 are configured to compare the counting code Q<0:3> and values of the respective bits of the setting time control code IPSET<0:3>, and output a plurality of comparison result signals. The signal combination stage 145 is configured to combine the plurality of comparison result signals outputted from the plurality of comparison stages 141, 142, 143 and 144 and output the period control signal QSSETP. In other words, in the present exemplary embodiment, the comparison section 140 activates and outputs the period control signal QSSETP when the counting code Q<0:3> and the setting time control code IPSET<0:3> are the same with each other.

Figure 9:
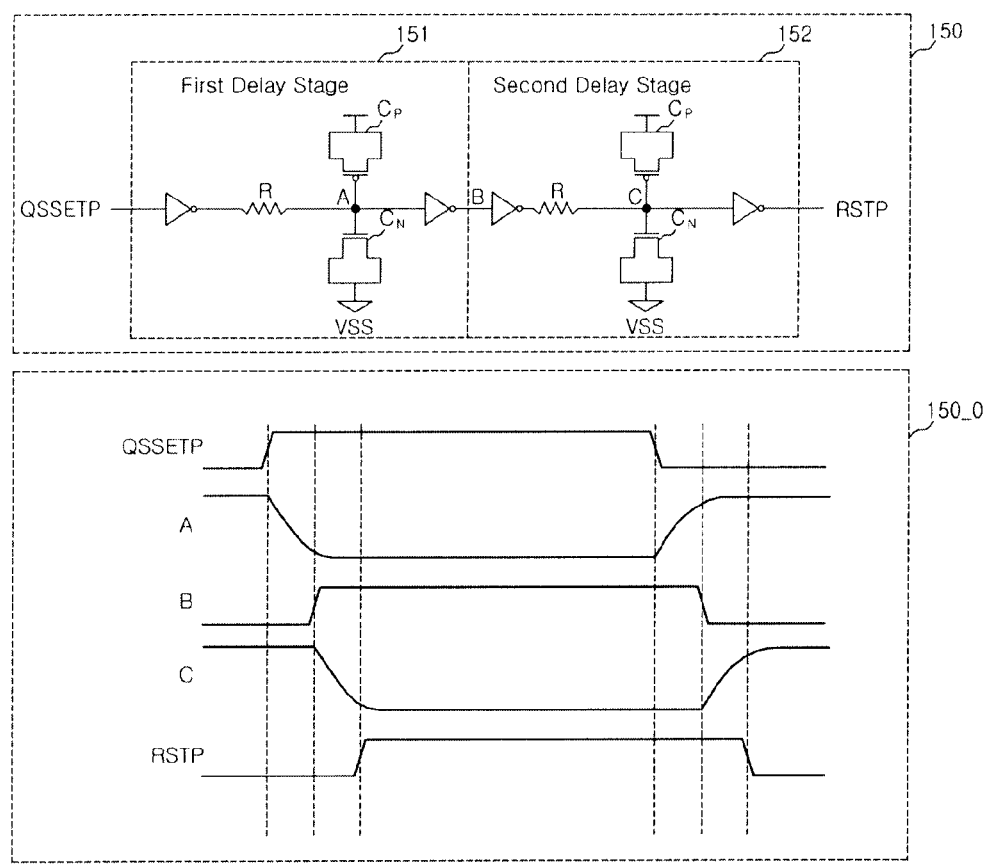
FIG. 9 is an exemplary configuration diagram of the latch reset pulse generation section of the period control signal generation unit shown in FIG. 5 and a timing diagram illustrating internal operations of the latch reset pulse generation section.

FIG. 9 is a configuration diagram of the latch reset pulse generation section of the period control signal generation unit shown in FIG. 5 and a timing diagram illustrating internal operations of the latch reset pulse generation section.

Referring to FIG. 9, the latch reset pulse generation section 150 includes a first delay stage 151 which delays the period control signal QSSETP, and a second delay stage 152 which delays a signal outputted from the first delay stage 151 and outputs the latch reset pulse signal RSTP. Each of the first delay stage 151 and the second delay stage 152 is composed of a resistor R and MOS capacitors $C_P$ and $C_N$, and is determined in its delay value by an RC time constant.

Figure 10:
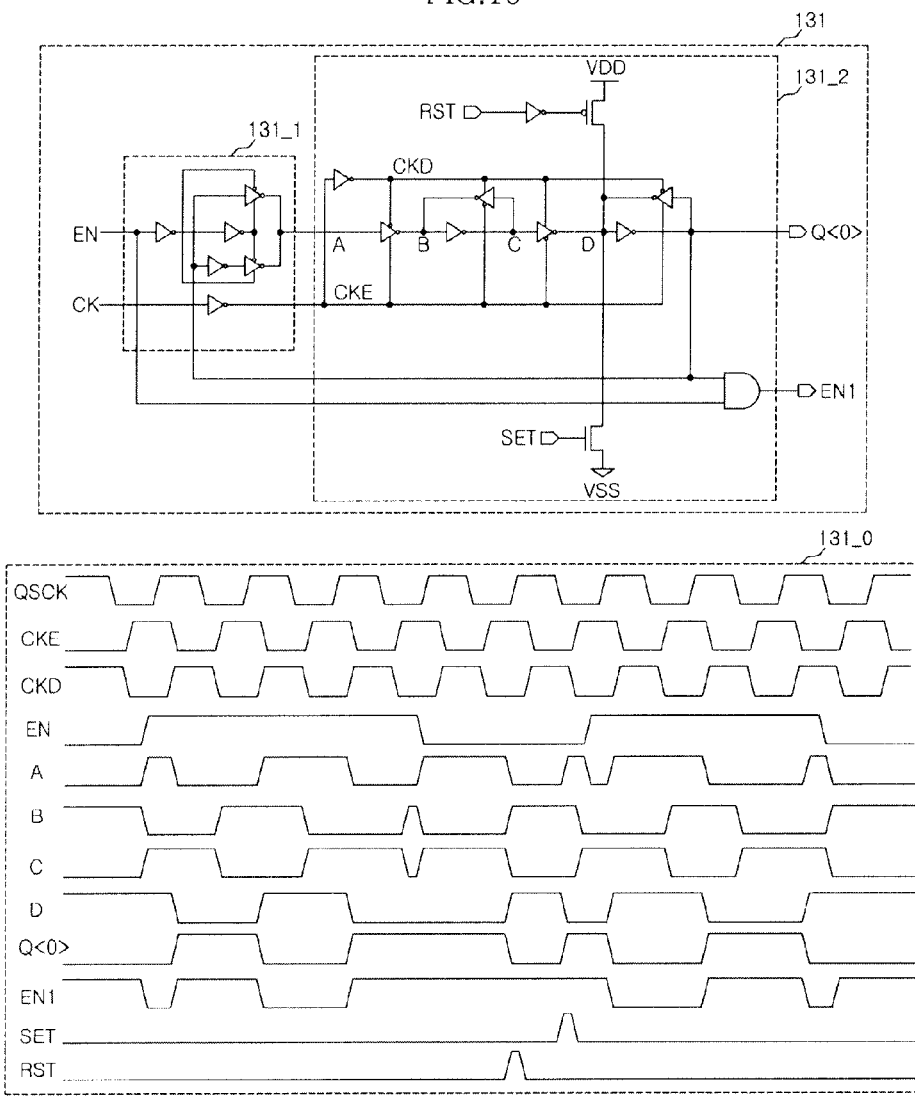
FIG. 10 is an exemplary configuration diagram of the counter section of the period control signal generation unit shown in FIG. 5 and a timing diagram illustrating internal operations of the counter section.

FIG. 10 is an exemplary configuration diagram of the counter section of the period control signal generation unit shown in FIG. 5 and a timing diagram illustrating internal operations of the counter section. FIG. 10 representatively shows a least significant 1 bit counter 131 among a plurality of 1 bit counters 131 through 134. The counter section 130 is configured to perform an up-counting operation.

Referring to FIG. 10, the 1 bit counter 131 includes a signal input part 131_1 and a latch part 131_2.

The signal input part 131_1 determines a signal level of an input node A of the latch part 131_2 in response to the count enable signal EN and the first counting code Q<0>.

The latch part 131_2 latches a signal outputted from the signal input part 131_1 under the control of the clock signal CK and outputs the first counting code Q<0> and a carry signal EN1. The carry signal EN1 is used as a count enable signal EN1 of the second 1 bit counter 132. An internal node of the latch part 131_2 is initialized or is changed to a specified level in response to the reset signal RST and a set signal SET.

Figure 11:
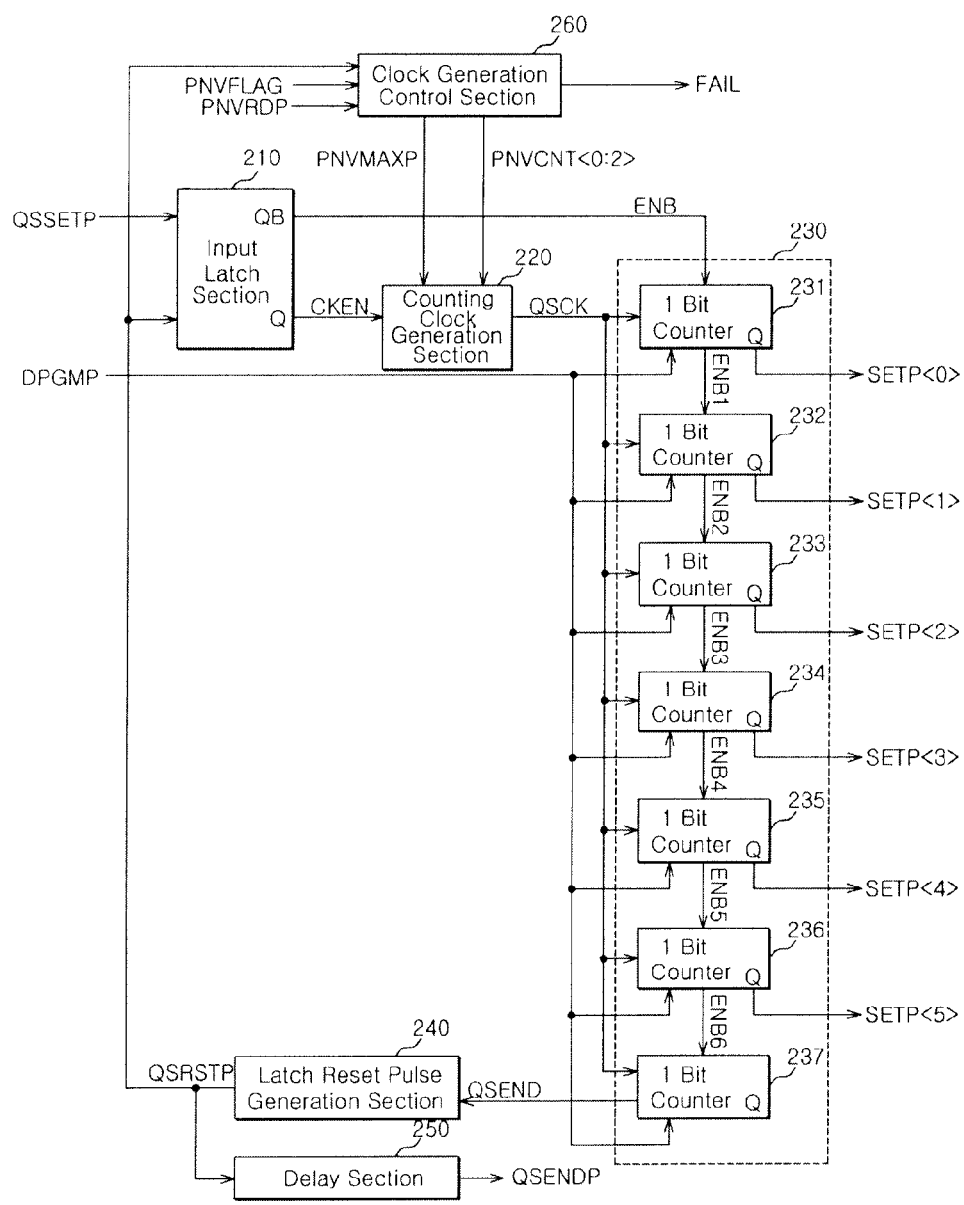
FIG. 11 is a configuration diagram illustrating an exemplary embodiment of the first write control code generation unit shown in FIG. 4.

FIG. 11 is a configuration diagram illustrating an exemplary embodiment of the first write control code generation unit shown in FIG. 4.

Referring to FIG. 11, the first write control code generation unit 200 includes an input latch section 210, a counting clock generation section 220, a write control code counter section 230, a latch reset pulse generation section 240, a delay section 250, and a clock generation control section 260.

Operations and the detailed configuration of the first write control code generation unit 200 configured as mentioned above will be described below in detail.

The input latch section 210 is configured to output a count enable signal ENB and a clock enable signal CKEN in response to the period control signal QSSETP and a latch reset pulse signal QSRSTP. The clock generation control section 260 is configured to output a cycle setting code PNVCNT<0:2> and a repetition end signal PNVMAXP, in response to the programming verification flag signal PNVFLAG and the latch reset pulse signal QSRSTP. Here, the cycle setting code PNVCNT<0:2> is updated by a specific number of times, e.g., a preset number of verifications. The clock generation control section 260 activates the repetition end signal PNVMAXP after the cycle setting code PNVCNT<0:2> is updated by the specific number of times. In the present exemplary embodiment, configuration is made in such a manner that the code value of the cycle setting code PNVCNT<0:2> increases at every update. For reference, the programming verification flag signal PNVFLAG is defined as a signal which indicates whether or not data are correctly programmed to memory cells. For example, the programming verification flag signal PNVFLAG has a low level if data stored in a cell equals to data to be programmed, but has a high level if the data stored in the cell does not equal to the data to be programmed.

The counting clock generation section 220 is configured to generate a counting clock signal QSCK in response to the clock enable signal CKEN and the repetition end signal PNVMAXP. The counting clock generation section 220 controls a toggling cycle of the counting clock signal QSCK depending upon the code value of the cycle setting code PNVCNT<0:2>. In the present exemplary embodiment, configuration is made in such a manner that the period of the toggling cycle of the counting clock signal QSCK increases as the code value of the cycle setting code PNVCNT<0:2> increases. In other words, according to an example, an applying time of a second "set" programming current, after applying a first "set" programming current and verifying a programmed data, is longer than the applying time of the first "set" programming current.

The write control code counter section 230 is configured to generate a counting code in response to the programming enable signal DPGMP, the count enable signal ENB and the counting clock signal QSCK, and output the first write control code SETP<N:0>. Accordingly, the update cycle of the first write control code SETP<N:0> is controlled in correspondence to the toggling cycle of the counting clock signal QSCK.

The latch reset pulse generation section 240 is configured to activate the latch reset pulse signal QSRSTP when the counting code of the write control code counter section 230 reach a certain value. For reference, in the present embodiment, a delay section 250, which is configured to delay the latch reset pulse signal QSRSTP by a certain delay value and output a delayed latch reset pulse signal QSENDP, is included.

Hereafter, the detailed configuration of the first write control code generation unit 200 will be described.

Figure 12:
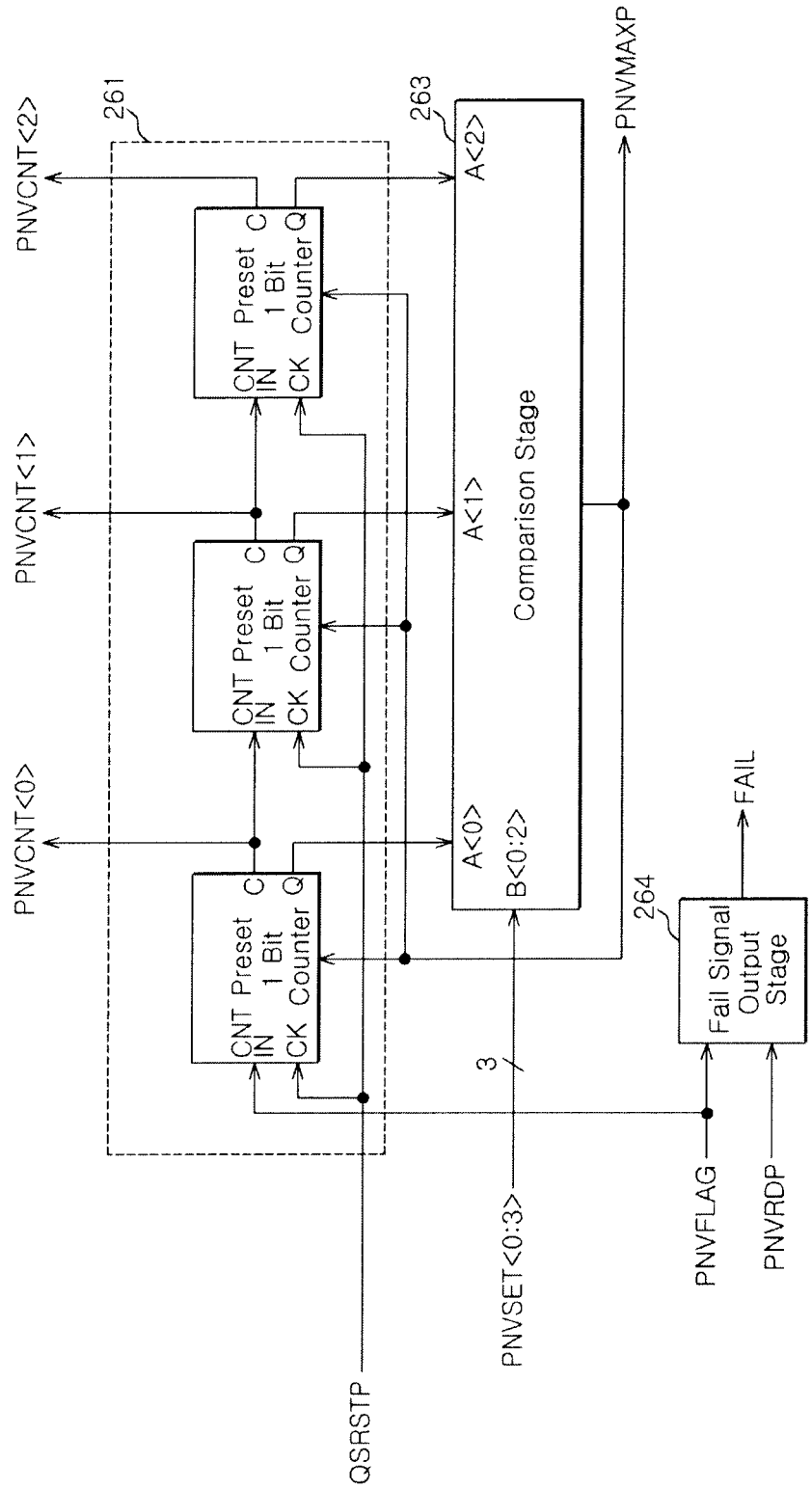
FIG. 12 is a configuration diagram illustrating an exemplary embodiment of the clock generation control section shown in FIG. 11.

FIG. 12 is a configuration diagram illustrating an exemplary embodiment of the clock generation control section shown in FIG. 11.

Referring to FIG. 12, the clock generation control section 260 includes a cycle setting code counter stage 261, a comparison stage 263, and a fail signal output stage 264.

The detailed configuration and the internal operations of the clock generation control section 260 configured as mentioned above will be described below in detail.

The cycle setting code counter stage 261 is configured to perform a counting operation in response to the programming verification flag signal PNVFLAG and the latch reset pulse signal QSRSTP.

The comparison stage 263 is configured to compare the reference code PNVSET<0:3> and counting codes outputted from the cycle setting code counter stage 261, and activate the repetition end signal PNVMAXP depending upon a comparison result. Namely, the comparison stage 263 activates and outputs the repetition end signal PNVMAXP when the reference code PNVSET<0:3> and the counting code are the same with each other.

The fail signal output stage 264 is configured to output a fail signal FAIL which is selectively activated, in response to the programming verification flag signal PNVFLAG and a programming verification signal PNVRDP. The programming verification flag signal PNVFLAG is a signal which indicates whether or not data are correctly programmed. The programming verification flag signal PNVFLAG maintains a high level until the data are correctly programmed to the memory cells, and becomes a low level after the data are correctly programmed to the memory cells. Accordingly, when the programming verification signal PNVRDP which is a signal instructing to verify whether programming is correctly performed to the memory cells is activated, if the programming verification flag signal PNVFLAG maintains the high level and the repetition end signal PNVMAXP is activated, the fail signal FAIL is activated to a high level. The fail signal output stage 264 may be configured by logic gates which logically combine the programming verification flag signal PNVFLAG and the programming verification signal PNVRDP, or a flip-flop which receives the programming verification flag signal PNVFLAG and the programming verification signal PNVRDP.

Figure 13:
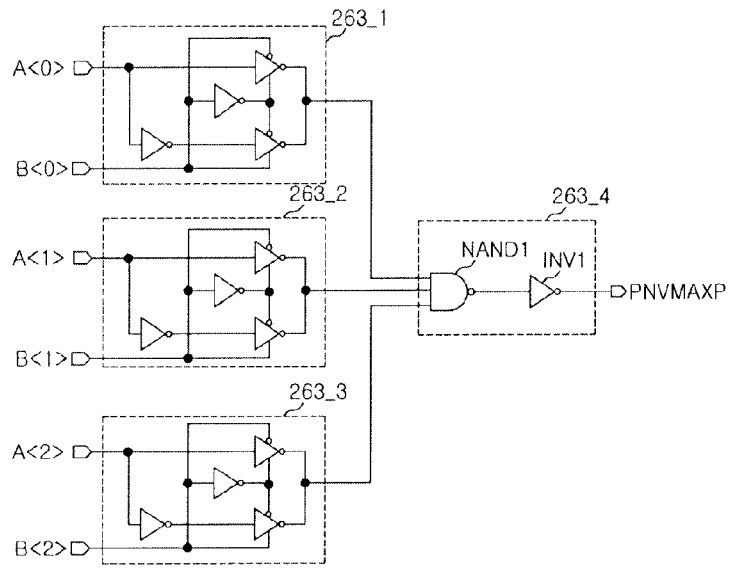
FIG. 13 is a configuration diagram illustrating an exemplary embodiment of the comparison stage of the clock generation control section shown in FIG. 12.

FIG. 13 is a configuration diagram illustrating an exemplary embodiment of the comparison stage of the clock generation control section shown in FIG. 12.

Referring to FIGS. 13 and 12 together, the comparison stage 263 includes a plurality of comparators 263_1, 263_2 and 263_3 which compare respective bit signals of the counting code outputted from the cycle setting code counter stage 261 and respective bit signals of the reference code PNVSET<0:3>, and a signal combiner 263_4 which combines comparison result signals outputted from the plurality of comparators 263_1, 263_2 and 263_3 and outputs the repetition end signal PNVMAXP.

Hereafter, the detailed configuration of the counting clock generation section 220 will be described.

Figure 14:
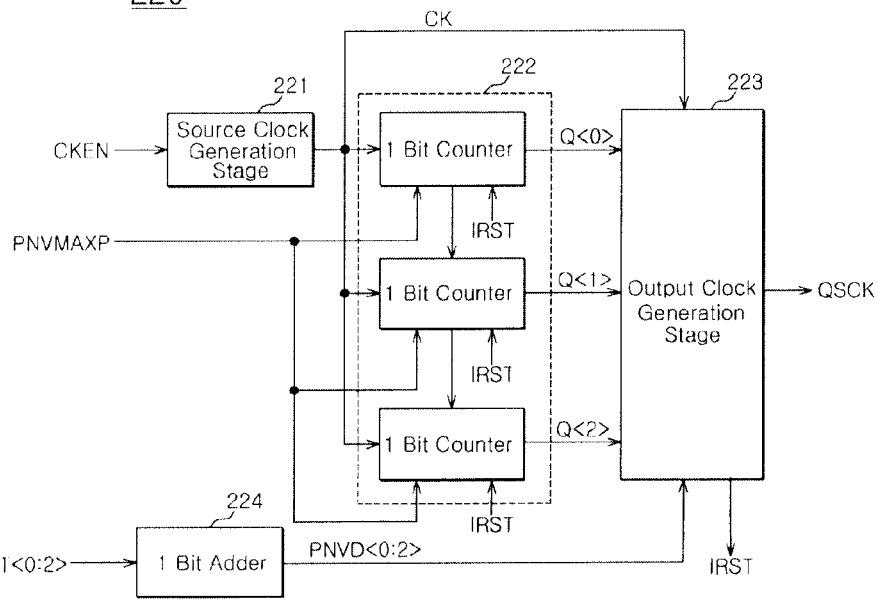
FIG. 14 is a configuration diagram illustrating an exemplary embodiment of the counting clock generation section shown in FIG. 11.

FIG. 14 is a configuration diagram illustrating an exemplary embodiment of the counting clock generation section shown in FIG. 11.

Referring to FIG. 14, the counting clock generation section 220 includes a source clock generation stage 221, an internal counter stage 222, an output clock generation stage 223, and a 1 bit adder 224.

The detailed configuration and internal operations of the counting clock generation section 220 configured as mentioned above will be described below in detail.

The source clock generation stage 221 is configured to output a source clock signal CK which toggles with a certain period of a cycle, in response to the clock enable signal CKEN. The source clock generation stage 221 may be configured by a ring oscillator, and the like.

The internal counter stage 222 is configured to perform a counting operation in response to the repetition end signal PNVMAXP, the source clock signal CK and an internal reset signal IRST, and output an internal counting code Q<0:2>.

The output clock generation stage 223 is configured to combine the internal counting code Q<0:2> and the cycle setting code PNVCNT<0:2> under the control of the source clock signal CK, and output the counting clock signal QSCK and the internal reset signal IRST.

Figure 15:
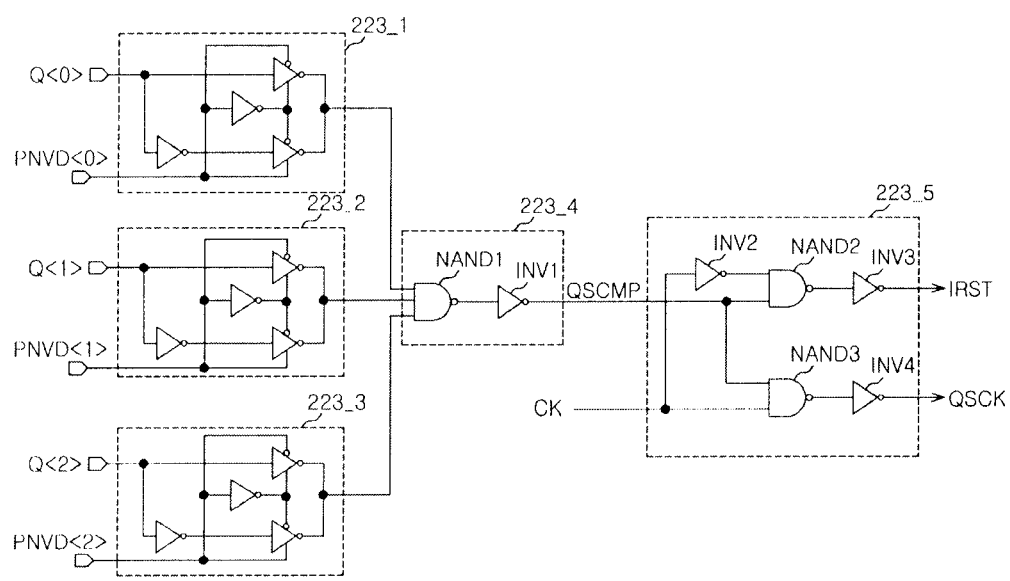
FIG. 15 is a configuration diagram illustrating an exemplary embodiment of the output clock generation stage of the counting clock generation section shown in FIG. 14.

FIG. 15 is a configuration diagram illustrating an exemplary embodiment of the output clock generation stage of the counting clock generation section shown in FIG. 14.

Referring to FIGS. 15 and 14 together, the output clock generation stage 223 includes a plurality of comparison parts 223_1, 223_2 and 223_3, a signal combination part 223_4, and a signal output part 223_5.

The plurality of comparison parts 223_1, 223_2 and 223_3 are configured to compare respective bit values of the internal counting code Q<0:2> and the cycle setting code PNVCNT<0:2> and output a plurality of comparison result signals. The signal combination part 223_4 is configured to combine the plurality of comparison result signals outputted from the plurality of comparison parts 223_1, 223_2 and 223_3, and output a combination signal QSCMP. The signal output part 223_5 is configured to output the counting clock signal QSCK and the internal reset signal IRST in response to the internal clock signal CK and the combination signal QSCMP.

For reference, in the present exemplary embodiment, the output clock generation part 223 is configured to compare the internal counting code Q<0:2> with the sum of the cycle setting code PNVCNT<0:2> and a certain value. For example, the output clock generation part 223 is configured to compare resultant signals PNVD<0:2> acquired by adding '1' to the code value of the cycle setting code PNVCNT<0:2> through the 1 bit counter 224, with the internal counting code Q<0:2>. In the present exemplary embodiment, the more the code value of the cycle setting code PNVCNT<0:2> increases, the more the togging cycle of the counting clock signal QSCK is gradually lengthened. For reference, the 1 bit counter 224 is an exemplary element.

Figure 16:
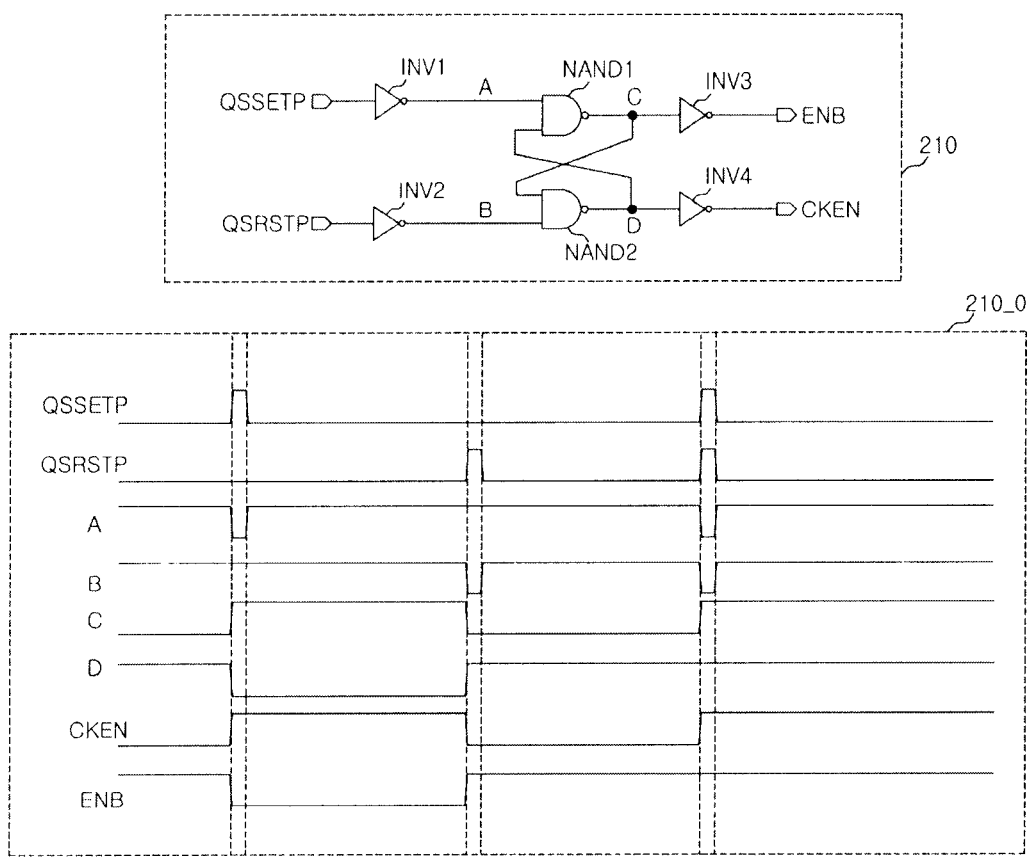
FIG. 16 is an exemplary configuration diagram of the input latch section of the first write control code generation unit shown in FIG. 11 and a timing diagram illustrating internal operations of the input latch section.

FIG. 16 is an exemplary configuration diagram of the input latch section of the first write control code generation unit shown in FIG. 11 and a timing diagram illustrating internal operations of the input latch section.

Referring to FIG. 16, the input latch section 210 includes an RS latch which is constituted by a plurality of NAND gates NAND1 and NAND2. Referring to a timing diagram 210_0, the input latch section 210 outputs the count enable signal ENB and the clock enable signal CKEN in response to the period control signal QSSETP and the latch reset pulse signal QSRSTP. In other words, if the period control signal QSSETP pulses to a high level, the count enable signal ENB is activated to a low level, and the clock enable signal CKEN is activated to a high level.

Figure 17:
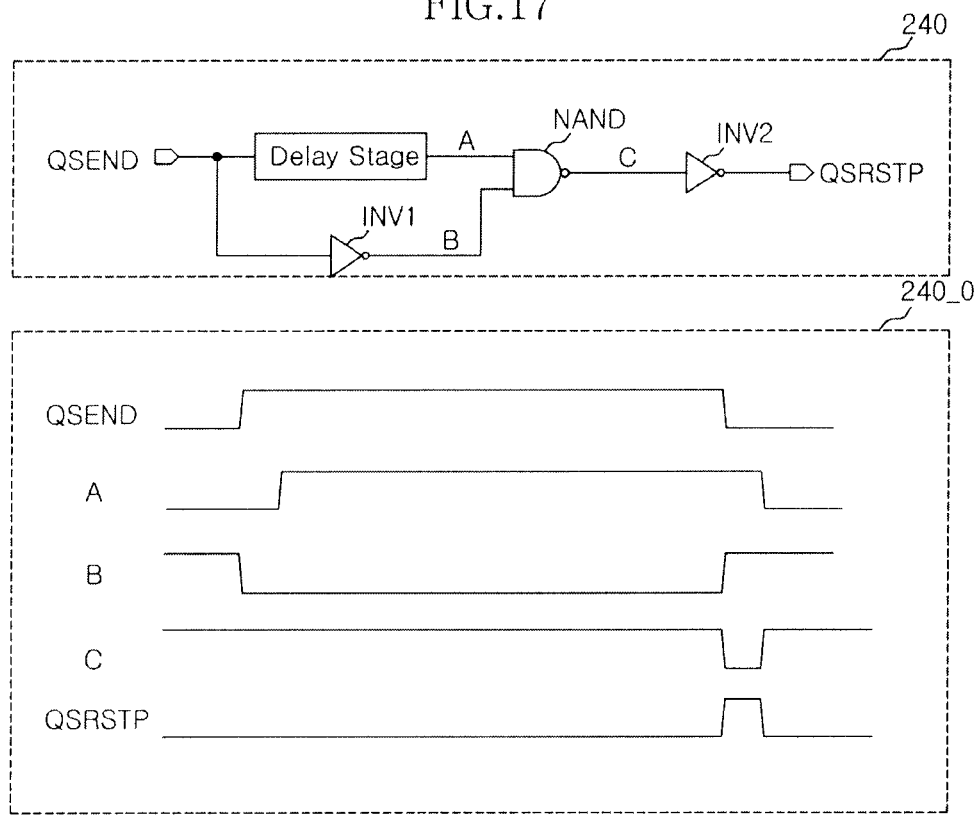
FIG. 17 is an exemplary configuration diagram of the latch reset pulse generation section of the first write control code generation unit shown in FIG. 11 and a timing diagram illustrating internal operations of the latch reset pulse generation section.

FIG. 17 is a configuration diagram of the latch reset pulse generation section of the first write control code generation unit shown in FIG. 11 and a timing diagram illustrating internal operations of the latch reset pulse generation section. The latch reset pulse generation section 240 is configured to generate the latch reset pulse signal QSRSTP when the counting code reaches a certain value.

Referring to FIGS. 17 and 11 together, when a signal QSEND outputted from a 1 bit counter 237 for detection, which receives a signal ENB6 outputted from a most significant 1 bit counter 236, is activated to a high level, the latch reset pulse generation section 240 generates the latch reset pulse signal QSRSTP which pulses to a high level, using the signal QSEND. That is to say, the latch reset pulse generation section 240 generates the signal which pulses to the high level, by NANDing a signal A, generated by delaying the signal QSEND outputted from the 1 bit counter 237 for detection through a delay stage, and an inverted signal of the signal QSEND.

Figure 18:
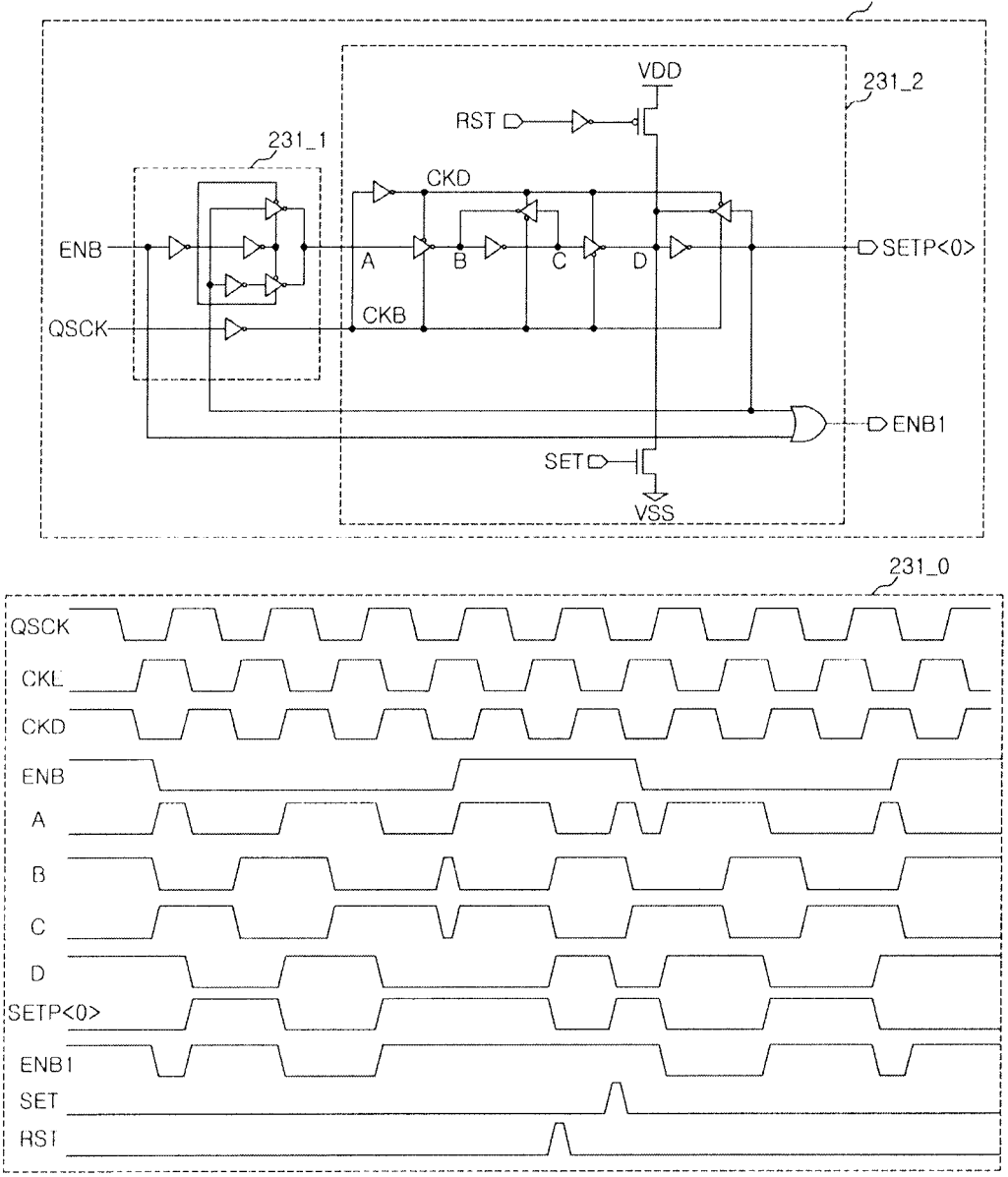
FIG. 18 is an exemplary configuration diagram of the write control code counter section of the first write control code generation unit shown in FIG. 11 and a timing diagram illustrating internal operations of the counter section.

FIG. 18 is an exemplary configuration diagram of the write control code counter section of the first write control code generation unit shown in FIG. 11 and a timing diagram illustrating internal operations of the counter section.

Referring to FIGS. 18 and 11 together, the write control code counter section 230 generates the counting code, which is counted in response to the programming enable signal DPGMP, the count enable signal ENB and the counting clock signal QSCK, and outputs the counting code as the first write control code SETP<N:0>. In other words, when the count enable signal ENB is activated to the low level, the write control code counter section 230 performs a counting operation under the control of the counting clock signal QSCK. Accordingly, since a down counting speed is controlled depending upon the toggling cycle of the counting clock signal QSCK, resultantly, the update cycle of the first write control code SETP<N:0> is controlled depending upon the toggling cycle of the counting clock signal QSCK.

FIG. 18 representatively shows a least significant 1 bit counter 231 among a plurality of 1 bit counters 231 through 237 which constitute the write control code counter section 230.

Referring to FIG. 18, the 1 bit counter 231 includes a signal input part 231_1 and a latch part 231_2.

The signal input part 231_1 determines a signal level of an input node A of the latch part 231_2 in response to the count enable signal ENB and the first counting code SETP<0>.

The latch part 231_2 latches a signal outputted from the signal input part 231_1 under the control of the counting clock signal QSCK, and outputs the first counting code SETP<0> and a borrow signal ENB1. The borrow signal ENB1 is used as a count enable signal ENB of the second 1 bit counter 232. An internal node of the latch part 231_2 is initialized or is changed to a specified level in response to the reset signal RST and a set signal SET.

Figure 19:
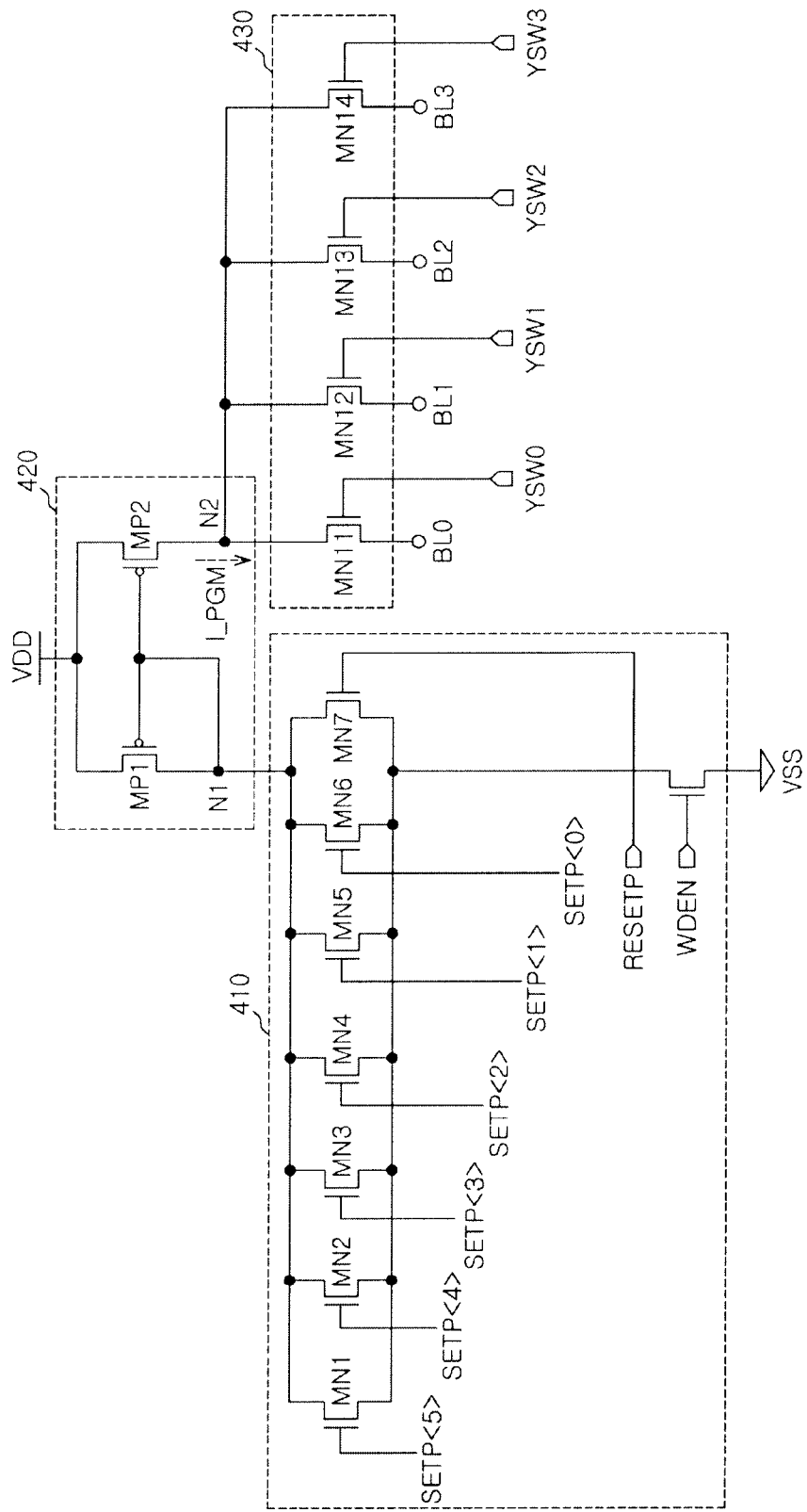
FIG. 19 is a configuration diagram illustrating an exemplary embodiment of the data write unit shown in FIG. 4.

FIG. 19 is a configuration diagram illustrating an exemplary embodiment of the data write unit shown in FIG. 4.

Referring to FIG. 19, the data write unit 400 includes a current control section 410, a current driving section 420 and a selection section 430.

The current control section 410 is configured to control a voltage level of a control node N1 according to a code combination of the first write control code SETP<N:0> and the second write control code RESETP when a write enable signal WDEN is activated. Here, a plurality of NMOS transistors MN1 through MN6, which are controlled by the first write control code SETP<N:0>, are selectively turned on by the code combination of the first write control code SETP<N:0>, and controls the voltage level of the control node N1. Also, an NMOS transistor MN7, which is controlled by the second write control code RESETP, is turned on when the second write control code RESETP is activated, and controls the voltage level of the control node N1. The first write control code SETP<N:0> is cyclically updated, and the second write control code RESETP is a signal which is inputted in a pulse type.

The current driving section 420 is configured to drive a programming current pulse I_PGM with a magnitude corresponding to the voltage level of the control node N1, to an output terminal N2. The programming current pulse I_PGM may be classified into a first programming current pulse corresponding to the first write control code SETP<N:0> and a second programming current pulse corresponding to the second write control code RESETP.

The selection section 430 is configured to output the programming current pulse I_PGM driven from the current driving section 420 to bit lines BL0 through BL3 which respectively correspond to a plurality of select signals YSW<0:3>.

Figure 20:
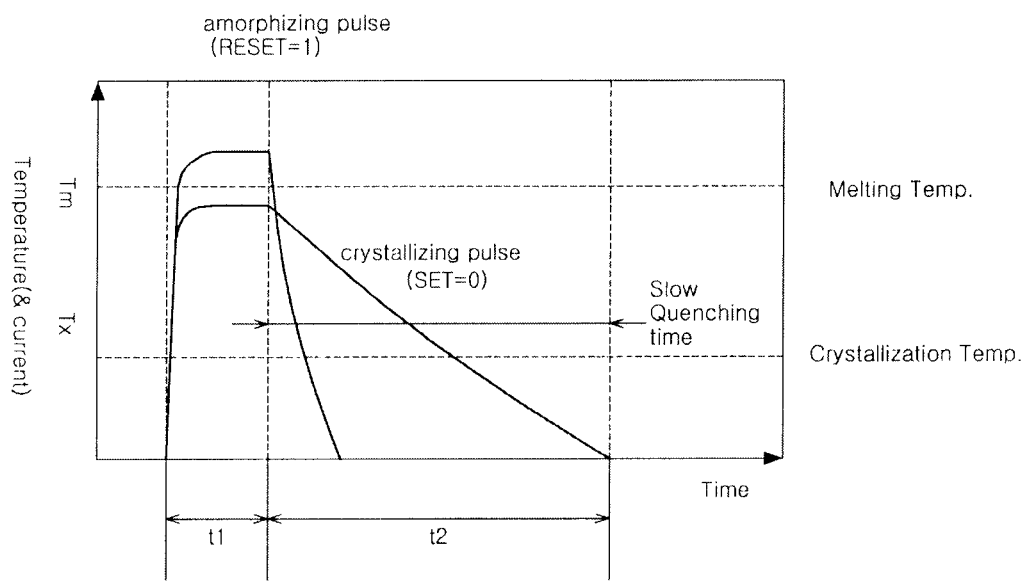
FIG. 20 is a graph showing programming current pulses outputted from the data write unit shown in FIG. 19.

FIG. 20 is a graph showing programming current pulses outputted from the data write unit shown in FIG. 19.

Referring to FIG. 20, the second programming current pulse is driven to be higher than a melting temperature for a short time, and the first programming current pulse is driven to be close to the melting temperature for an initial first pulse period t1 and gradually decrease for a second pulse period t2.

The second pulse period t2 of the first programming current pulse is lengthened as the update cycle of the first write control code SETP<N:0> becomes long. Accordingly, since a time for which the programming current pulse supplied to a memory cell gradually decreases becomes long as the second pulse period t2 is lengthened, a crystallization resistance value of the phase change memory cell decreases in correspondence to the time that becomes long. For reference, in the graph, the second programming current pulse is shown as an amorphizing pulse, and the first programming current pulse is shown as a crystallizing pulse.

FIG. 21 is a timing diagram illustrating internal operations of the semiconductor memory apparatus in accordance with the embodiment of the present invention.

Internal operations of the semiconductor memory apparatus in accordance with the exemplary embodiment of the present invention will be described below with reference to the timing diagram of FIG. 21. Maximum five programming periods may be progressed. At each time the period is progressed, it is verified whether data are correctly programmed to memory cells, and whether to end a programming operation or to progress a next programming period is determined depending upon a verification result.

In the present exemplary embodiment, the first write control code SETP<N:0> are updated with different cycles for the respective five periods. In other words, the update cycle of the first write control code SETP<N:0> is controlled in correspondence to the toggling cycle of the counting clock signal QSCK. In the present exemplary embodiment, since the toggling cycle of the counting clock signal QSCK is lengthened as the respective operations are progressed, the update cycle of the first write control code SETP<N:0> is gradually lengthened as the respective operations are progressed. As a result, as the respective operations (e.g., program/verify operation) are progressed, a decreasing time of the first programming current pulse (e.g., quenching time) with a magnitude corresponding to the code value of the first write control code SETP<N:0> increases.

In the first timing diagram, the Case 1 represents a case in which, since data are correctly programmed to the memory cells in a third period, the programming verification flag signal PNVFLAG becomes a low level and a programming period is not progressed any more. The Case 2 represents a case in which, since data are not correctly programmed to the memory cells even after a fifth programming period is progressed, the programming verification flag signal PNVFLAG maintains continuously a high level and the fail signal FAIL is activated to a high level. That is to say, the Case 2 represents a case in which, even though the programming operation is progressed five times through the total five programming periods, data are not finally correctly programmed to the memory cells.

As is apparent from the above descriptions, in the semiconductor memory apparatus in accordance with the embodiment of the present invention, a pattern in which a programming current pulse is supplied to a memory cell can be controlled. That is to say, by driving the programming current pulse in such a way as to have different supply times for a plurality of respective periods, it is possible to stably program a plurality of memory cells with different programming characteristics. The number of the plurality of periods may be set to a value capable of stably and most quickly programming all the memory cells.

So far, embodiments of the present invention have been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Furthermore, the configurations of transistors may be changed as the occasion demands in order to realize the same function. That is to say, the configurations of a PMOS transistor and an NMOS transistor may be replaced with each other, and as the occasion demands, various transistors may be employed. In addition, the configuration of a logic gate may be changed as the occasion demands to realize the same function. That is to say, a NAND unit, a NOR unit, and so forth can be configured through various combinations of NAND gates, NOR gates and inverters. Since these embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a first write control code generation unit configured to generate a first write control code which is updated with different cycles which have different periods, in response to a programming verification flag signal and a programming enable signal; and
a data write unit configured to output a first programming current pulse with a magnitude corresponding to a code combination of the first write control code which is updated.

2. The semiconductor memory apparatus according to claim 1, further comprising:
a second write control code generation unit configured to generate a second write control code which is activated for a first time, in response to the programming enable signal,
wherein the data write unit is configured to output the first programming current pulse with the magnitude corresponding to the code combination of the first write control code which is updated, or a second programming current pulse with a magnitude corresponding to the second write control code.

3. The semiconductor memory apparatus according to claim 1, wherein the update cycle of the first write control code is gradually lengthened as the respective programming and verifying operations are progressed.

4. The semiconductor memory apparatus according to claim 1, wherein the first write control code generation unit comprises:
an input latch section configured to output a count enable signal and a clock enable signal in response to a period control signal and a latch reset pulse signal;
a clock generation control section configured to output a cycle setting code and a repetition end signal, in response to the programming verification flag signal and the latch reset pulse signal, wherein the cycle setting code is updated by a specific number of times;
a counting clock generation section configured to generate a counting clock signal in response to the clock enable signal and the cycle setting code, wherein a period of a toggling cycle of the counting clock signal is changed depending upon a code value of the cycle setting code;
a write control code counter section configured to generate a counting code which is counted in response to the programming enable signal, the count enable signal and the counting clock signal, and output the first write control code; and a latch reset pulse generation section configured to generate the latch reset pulse signal when the counting code reaches a first value.

5. The semiconductor memory apparatus according to claim 4, wherein the clock generation control section activates the repetition end signal after the cycle setting code is updated by the specific number of times.

6. The semiconductor memory apparatus according to claim 4, wherein the code value of the cycle setting code increases in each time the cycle setting code is updated.

7. The semiconductor memory apparatus according to claim 4, wherein the update cycle of the first write control code is controlled in correspondence to the toggling cycle of the counting clock signal.

8. The semiconductor memory apparatus according to claim 4, wherein the programming verification flag signal is a signal which indicates whether or not data are correctly programmed.

9. The semiconductor memory apparatus according to claim 4, wherein the clock generation control section comprises:
- a cycle setting code counter stage configured to perform a counting operation under the control of the programming verification flag signal and the latch reset pulse signal;
- a comparison stage configured to compare a reference code and a counting code outputted from the cycle setting code counter stage, and output a comparison result as the repetition end signal; and
- a fail signal output stage configured to output a fail signal which is selectively activated, in response to the programming verification flag signal and a programming verification signal.

10. The semiconductor memory apparatus according to claim 4, wherein the counting clock generation section comprises:
- a source clock generation stage configured to output a source clock signal which toggles with a specific cycle, in response to the clock enable signal;
- an internal counter stage configured to perform a counting operation in response to the repetition end signal, the source clock signal and an internal reset signal and output an internal counting code; and
- an output clock generation stage configured to combine the internal counting code and the cycle setting code under the control of the source clock signal, and output the counting clock signal and the internal reset signal.

11. The semiconductor memory apparatus according to claim 10, wherein the output clock generation stage comprises:
- a plurality of comparison parts configured to compare respective bit values of the internal counting code and the cycle setting code, and output a plurality of comparison result signals;
- a signal combination part configured to combine the plurality of comparison result signals outputted from the plurality of comparison parts, and output a combination signal; and
- a signal output part configured to output the counting clock signal and the internal reset signal in response to the internal clock signal and the combination signal.

12. The semiconductor memory apparatus according to claim 10, wherein the output clock generation stage sums the cycle setting code and a predetermined code value, and then combines a resultant code with the internal counting code.

13. A semiconductor memory apparatus comprising:
- a period control signal generation unit configured to generate a period control signal which is activated after a first time, in response to a programming enable signal;
- a first write control code generation unit configured to generate a first write control code which is updated with different cycles which have different periods, in response to a programming verification flag signal and a programming enable signal, wherein the first write control code generation unit updates the first write control code in response to the period control signal;
- a second write control code generation unit configured to generate a second write control code, in response to the programming enable signal; and
- a data write unit configured to output a first programming current pulse with a magnitude corresponding to a code combination of the first write control code which is updated or a second programming current pulse with a magnitude corresponding to the second write control code.

14. The semiconductor memory apparatus according to claim 13, wherein the update cycle of the first write control code is gradually lengthened as the respective programming and verifying operations are progressed.

15. The semiconductor memory apparatus according to claim 13, wherein the first time is controlled depending upon a code value of a setting time control code.

16. The semiconductor memory apparatus according to claim 13, wherein the first write control code generation unit comprises:
- an input latch section configured to output a count enable signal and a clock enable signal in response to the period control signal and a latch reset pulse signal;
- a clock generation control section configured to output a cycle setting code and a repetition end signal, in response to the programming verification flag signal and the latch reset pulse signal, wherein the cycle setting code is updated by a specific number of times;
- a counting clock generation section configured to generate a counting clock signal in response to the clock enable signal and the cycle setting code, wherein a period of a toggling cycle of the counting clock signal is changed depending upon a code value of the cycle setting code;
- a write control code counter section configured to generate a counting code which is counted in response to the programming enable signal, the count enable signal and the counting clock signal, and output the first write control code; and
- a latch reset pulse generation section configured to generate the latch reset pulse signal when the counting code reaches a first value.

17. The semiconductor memory apparatus according to claim 16, wherein the clock generation control section activates the repetition end signal after the cycle setting code is updated by the specific number of times.

18. The semiconductor memory apparatus according to claim 16, wherein the code value of the cycle setting code increases in each time the cycle setting code is updated.

19. The semiconductor memory apparatus according to claim 16, wherein the update cycle of the first write control code is controlled in correspondence to the toggling cycle of the counting clock signal.

20. The semiconductor memory apparatus according to claim 16, wherein the programming verification flag signal is a signal which indicates whether or not data are correctly programmed.

21. The semiconductor memory apparatus according to claim 16, wherein the clock generation control section comprises:
a cycle setting code counter stage configured to perform a counting operation under the control of the programming verification flag signal and the latch reset pulse signal;
a comparison stage configured to compare a reference code and a counting code outputted from the cycle setting code counter stage, and output a comparison result as the repetition end signal; and
a fail signal output stage configured to output a fail signal which is selectively activated, in response to the programming verification flag signal and a programming verification signal.

22. The semiconductor memory apparatus according to claim 16, wherein the counting clock generation section comprises:
a source clock generation stage configured to output a source clock signal which toggles with a specific cycle, in response to the clock enable signal;
an internal counter stage configured to perform a counting operation in response to the repetition end signal, the source clock signal and an internal reset signal and output an internal counting code; and
an output clock generation stage configured to combine the internal counting code and the cycle setting code under the control of the source clock signal, and output the counting clock signal and the internal reset signal.

23. The semiconductor memory apparatus according to claim 22, wherein the output clock generation stage comprises:
a plurality of comparison parts configured to compare respective bit values of the internal counting code and the cycle setting code, and output a plurality of comparison result signals;
a signal combination part configured to combine the plurality of comparison result signals outputted from the plurality of comparison parts, and output a combination signal; and
a signal output part configured to output the counting clock signal and the internal reset signal in response to the internal clock signal and the combination signal.

24. The semiconductor memory apparatus according to claim 22, wherein the output clock generation stage sums the cycle setting code and a predetermined code value and then combines a resultant code with the internal counting code.

25. A semiconductor memory apparatus comprising:
an input latch section configured to output a count enable signal and a clock enable signal in response to a period control signal which is activated after a preset time and a latch reset pulse signal;
a clock generation control section configured to output a cycle setting code and a repetition end signal, in response to a programming verification flag signal and the latch reset pulse signal, wherein the cycle setting code is updated by a specific number of times;
a counting clock generation section configured to generate a counting clock signal in response to the clock enable signal and the cycle setting code, wherein a period of a toggling cycle of the counting clock signal is changed depending upon a code value of the cycle setting code;
a write control code counter section configured to generate a counting code which is counted in response to a programming enable signal, the count enable signal and the counting clock signal, and output a write control code;
a latch reset pulse generation section configured to generate the latch reset pulse signal when the counting code reach a predetermined value; and
a data write unit configured to output a programming current pulse with a magnitude corresponding to a code combination of the write control code which is updated.

26. The semiconductor memory apparatus according to claim 25, wherein the clock generation control section activates the repetition end signal after the cycle setting code is updated by the specific number of times.

27. The semiconductor memory apparatus according to claim 25, wherein the code value of the cycle setting code increases in each time the cycle setting code is updated.

28. The semiconductor memory apparatus according to claim 25, wherein the update cycle of the first write control code is controlled in correspondence to the toggling cycle of the counting clock signal.

29. The semiconductor memory apparatus according to claim 25, wherein the programming verification flag signal is a signal which indicates whether or not data are correctly programmed.

30. The semiconductor memory apparatus according to claim 25, wherein the clock generation control section comprises:
a cycle setting code counter stage configured to perform a counting operation under the control of the programming verification flag signal and the latch reset pulse signal;
a comparison stage configured to compare a reference code and a counting code outputted from the cycle setting code counter stage, and output a comparison result as the repetition end signal; and
a fail signal output stage configured to output a fail signal which is selectively activated, in response to the programming verification flag signal and a programming verification signal.

31. The semiconductor memory apparatus according to claim 25, wherein the counting clock generation section comprises:
a source clock generation stage configured to output a source clock signal which toggles with a specific cycle, in response to the clock enable signal;
an internal counter stage configured to perform a counting operation in response to the repetition end signal, the source clock signal and an internal reset signal and output an internal counting code; and
an output clock generation stage configured to combine the internal counting code and the cycle setting code under the control of the source clock signal, and output the counting clock signal and the internal reset signal.

32. The semiconductor memory apparatus according to claim 31, wherein the output clock generation stage comprises:
a plurality of comparison parts configured to compare respective bit values of the internal counting code and the cycle setting code and output a plurality of comparison result signals;
a signal combination part configured to combine the plurality of comparison result signals outputted from the plurality of comparison parts, and output a combination signal; and
a signal output part configured to output the counting clock signal and the internal reset signal in response to the internal clock signal and the combination signal.

33. The semiconductor memory apparatus according to claim 31, wherein the output clock generation stage sums the cycle setting code and a predetermined code value and then combines resultant code with the internal counting code.

* * * * *